United States Patent [19]

Hanazato et al.

[11] Patent Number: 5,129,040
[45] Date of Patent: Jul. 7, 1992

[54] NEURAL NETWORK SYSTEM FOR IMAGE PROCESSING

[75] Inventors: Yoshio Hanazato; Satoru Isoda; Satoshi Ueyama; Hiroaki Kawakubo; Mitsuo Maeda, all of Hyogo

[73] Assignee: Mitsubishi Denki Kabushiki Kaisha, Japan

[21] Appl. No.: 546,377

[22] Filed: Jun. 27, 1990

[30] Foreign Application Priority Data

Jun. 28, 1989 [JP] Japan .................................. 1-167769

[51] Int. Cl.[5] .................. G06G 7/16; H01L 31/08
[52] U.S. Cl. .................................. 395/25; 395/22; 382/14
[58] Field of Search ............... 364/513, 807; 307/201; 395/25; 382/14

[56] References Cited

U.S. PATENT DOCUMENTS

| 4,934,782 | 6/1990 | Soffer et al. | 350/162.12 |
|---|---|---|---|
| 4,943,556 | 7/1990 | Szu | 505/1 |
| 4,988,891 | 1/1991 | Mashiko | 307/201 |
| 4,994,664 | 2/1991 | Veldkamp | 250/216 |
| 5,008,833 | 4/1991 | Agranat et al. | 364/513 |

FOREIGN PATENT DOCUMENTS 62-57266 3/1987 Japan .

OTHER PUBLICATIONS

Koch, "Resistive Networks for Computer Vision: An Overview", *An Introduction to Neural and Electronic Networks*, 1990, Academic Press, pp. 293-305.
Mead et al., "A Silicon Model of Early Visual Processing", *Neural Networks*, vol. 1 1988 pp. 91-97.
Hutchinson et al, "Computing Motion Using Analog and Binary Resistive Networks", *IEEE Computer*, 1988 pp. 52-63.
Hopfield et al, "Computing with Neural Circuits: A Model", Science vol. 233, pp. 625-633, Aug. 8, 1986.
Computing Motion in the Presence of Discontinuities: Algorithm and Analog Networks; C. Koch; Nato ASI Series vol. F41; Neural Computers 1988.

*Primary Examiner*—Allen R. MacDonald

[57] ABSTRACT

A visual information processing device has a pair of neural networks which respectively comprise an upper layer and a lower layer of the device. Each of the pair of neural networks comprises a semiconductor integrated circuit having a plurality of neuron circuit regions which are disposed in a matrix form, each of the neuron circuit regions performing a neuron function; a molecule film having a photoelectric function and provided on the semiconductor integrated circuit, the molecule film having (i) a plurality of $T_{ij}$ signal input sections each performing a wiring function among the plurality of neuron circuit regions, in each of which a $T_{ij}$ signal representing the bonding strength among the plurality of neuron circuit regions is optically written, and (ii) a plurality of video input sections each performing a sensor function of sensing a visual image in which one pixel corresponds to one neuron circuit region; and a wiring for electrically connecting the semiconductor integrated circuit and the molecule film. Each of the plurality of neuron circuit regions is bonded with the neighboring neuron circuit regions in each of the pair of neural networks comprising the upper and lower layers, and each of the plurality of neuron circuit regions is bonded with the corresponding one between the pair of neural networks.

17 Claims, 6 Drawing Sheets

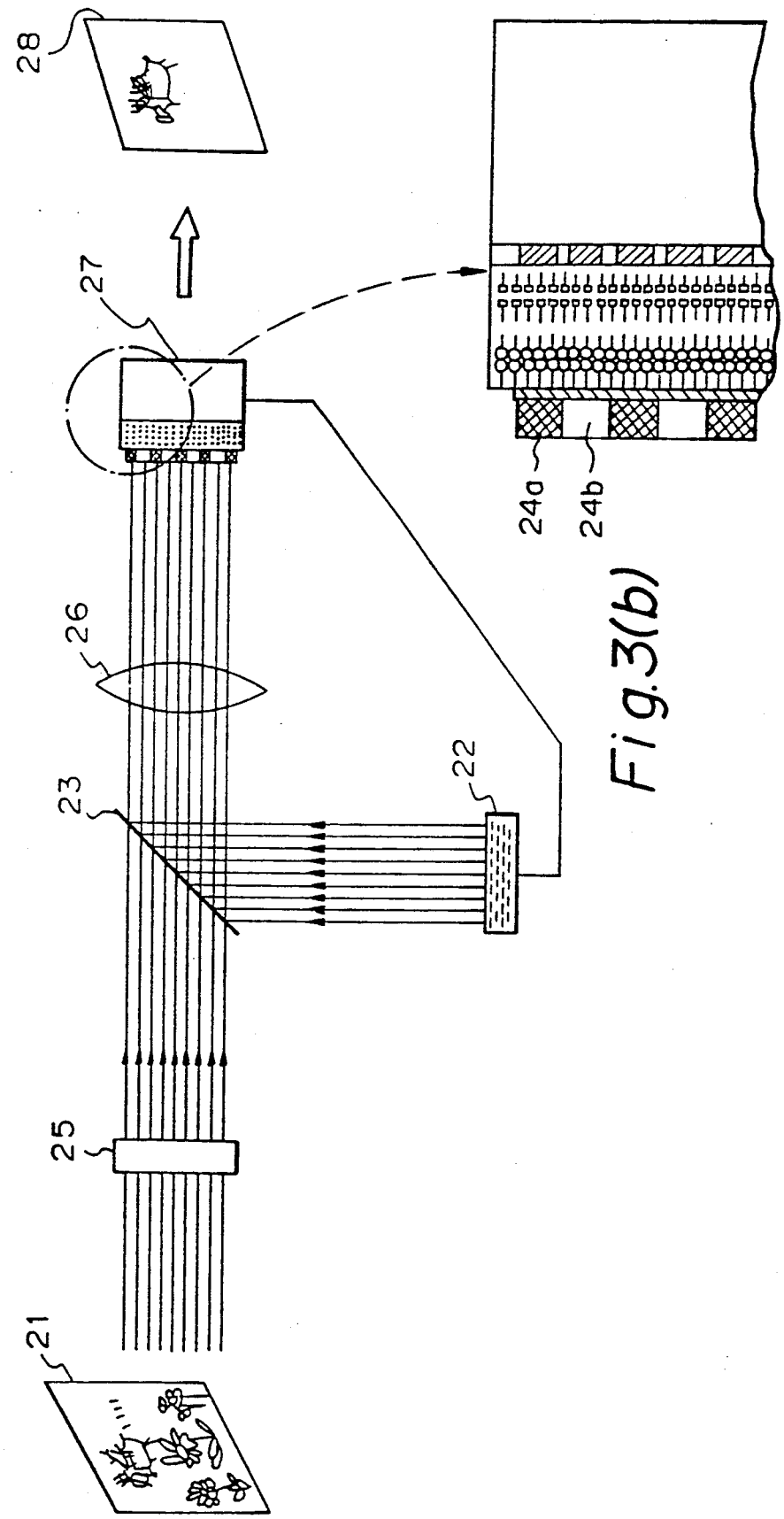

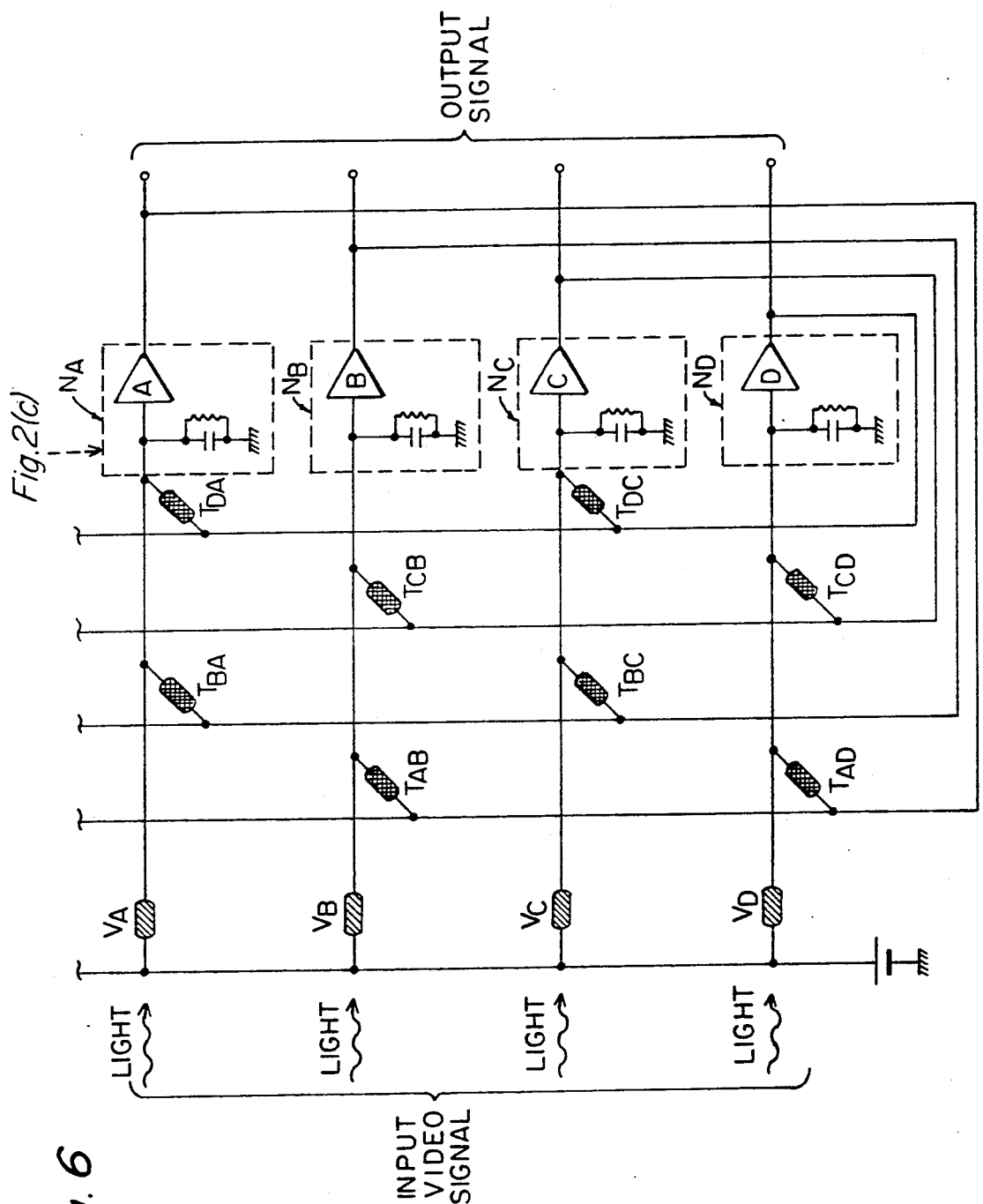

NEURAL NETWORK SYSTEM FOR IMAGE PROCESSING

BACKGROUND OF THE INVENTION

1. Field of the Invention

The present invention relates to a visual information processing device which is capable of processing speed information (optical flow) for an object moving at high speed.

2. Description of the Related Art

FIG. 1 shows a three-dimensional resistance circuit network 1 for processing an optical flow, as presented, for example, in ["Neural Computer", Berlin, (1988), p.101, C. Koch, et al]. Shown in the figure are a variable power supply 2, a capacitor 3, a variable resistor 4, connecting points 5 and 6 of the three-dimensional resistance circuit network 1, a resistor 7 for connecting the points of an upper layer and an under layer, a variable resistor 8 for connecting the points in an upper layer surface (or an under layer surface), and a switch 9 connected to the resistor 8.

Next, the operation will be explained. The voltage of the variable power supply 2, the value of the variable resistor 4, and the value of the variable resistor 8 for connecting the points, which are determined from input data obtained from photoelectric conversion devices such as photodiodes, are simultaneously input to the connecting points of the three-dimensional resistance circuit network at a certain time interval. The variations in the voltage at the connecting points 5 and 6 resulting from a variation in an optical signal, caused by the movement of an object, disturbs the circuit network system. The three-dimensional resistance circuit network then enters a new, stable state of minimum power consumption in accordance with Kirchoff's law. From the voltage value of each of the connecting points 5 and 6 which have reached a stable state, two-dimensional speed vectors in the x and y directions can be determined. In this case, however, since the contour of the object becomes unclear, the switch 9 is provided so that a contour can be formed at a rational position.

A conventional visual information processing device has been constructed as mentioned above. As a result, the following problems exist in that the construction of a three-dimensional resistance network in an integrated circuit is difficult and the formation of photoelectric conversion devices such as CCDs, photodiode arrays or the like in the same information processing device is also difficult.

SUMMARY OF THE INVENTION

The present invention has been devised to eliminate the above problems. It is an object of the present invention to provide a visual information processing device which can be efficiently incorporated in other devices and which is capable of processing the speed information for a moving object in realtime.

A visual information processing device according to the present invention comprises a pair of layered neural network units each having an integrated circuit device in which a neuron circuit region is provided in a matrix form and a molecule film device provided on the integrated circuit region. The molecule film device has a photoelectric function section having a construction in which a molecule multilayer having a heterojunction is sandwiched between electrodes. The photoelectric function section includes a video signal input section in which one pixel corresponds to one neuron and a $T_{ij}$ signal input section. The neuron circuit region has a structure in which the four closest neurons are connected in the same layer and the one-to-one corresponding neurons are connected between the layers.

The visual information processing device of the present invention is constructed as mentioned above. A bonding strength matrix $T_{ij}$ between neurons can be written from the outside and, what is more, a video signal can be input simultaneously. Neurons are bonded so that the speed information on a moving object can be obtained by an interconnection only between closest neurons. As a result, the number of interconnections among neurons and of $T_{ij}$ can be diminished and input video information can be processed at high speed.

According to the present invention, a video signal input section and a $T_{ij}$ signal input section are provided in a photoelectric function section formed by a molecule multiplayer having a heterojunction sandwiched between electrodes. A video input signal has a one-pixel one-neuron correspondence. A neural network, in which a network is assembled so that the respective neurons are connected with the five neighboring neurons in the $T_{ij}$ signal input section of the photoelectric function section, is constructed on an integrated circuit having only the neuron sections incorporated. Therefore, a $T_{ij}$ signal can be written from the outside at the same time an image sensor starts to function, thus enabling a visual information processing system capable of processing the video signal input and the speed vector of a moving object at a high speed to be obtained.

Also, according to the present invention, since a photoelectric function section having a construction in which a molecule multilayer having a heterojunction is sandwiched between electrodes can be easily formed on an integrated circuit, the density of neurons per unit area in an information processing device can be easily increased by constructing a three-dimensional visual information processing device.

These and other objects, features and advantages of the present invention will become clear when reference is made to the following description of the preferred embodiments of the present invention, together with reference to the accompanying drawings.

BRIEF DESCRIPTION OF THE DRAWINGS

FIGS. 3(a)–(b) are configurational views of a visual information processing system constructed using the visual information processing device of FIG. 2;

FIG. 6 is an electrical schematic of FIG. 5.

DESCRIPTION OF THE PREFERRED EMBODIMENTS

An embodiment of the present invention will be explained hereinunder with reference to the accompanying drawings.

Figure 1:
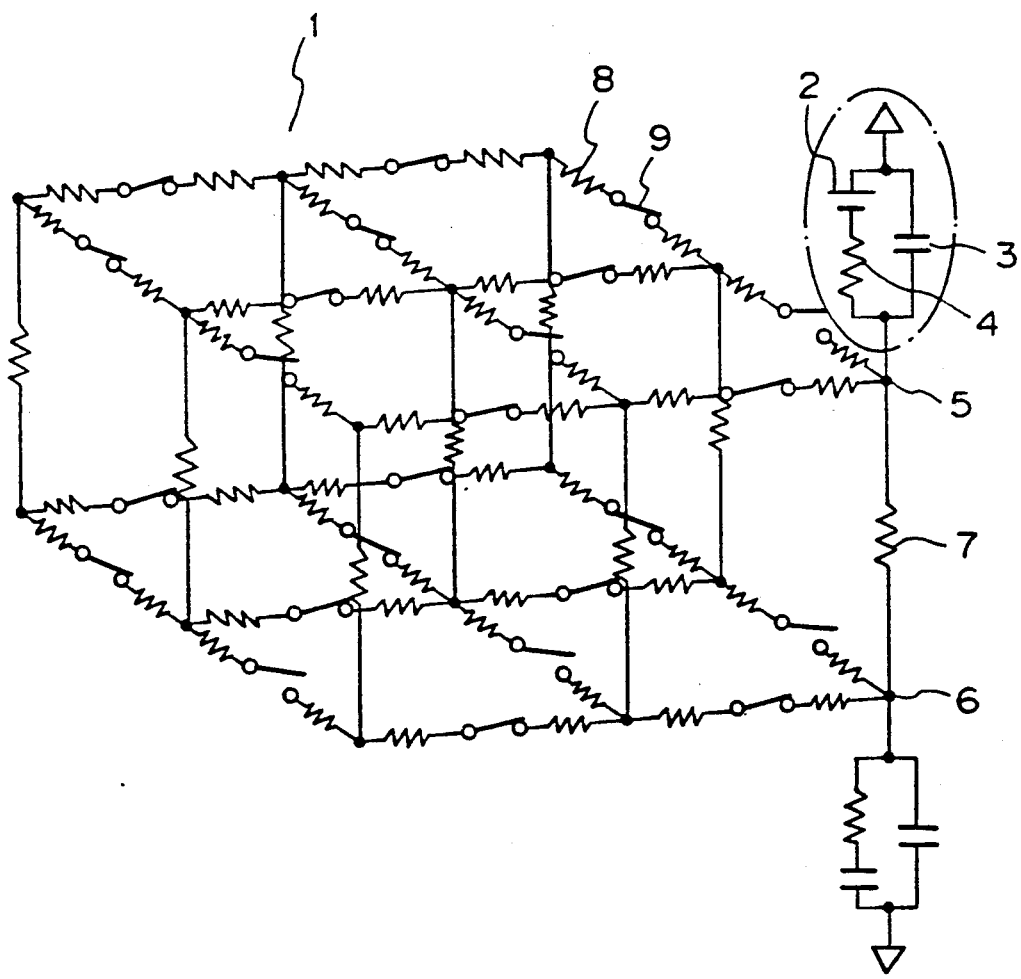
FIG. 1 is a conventional three-dimensional resistance circuit network for calculating the speed information of an object.
Figure 2A:
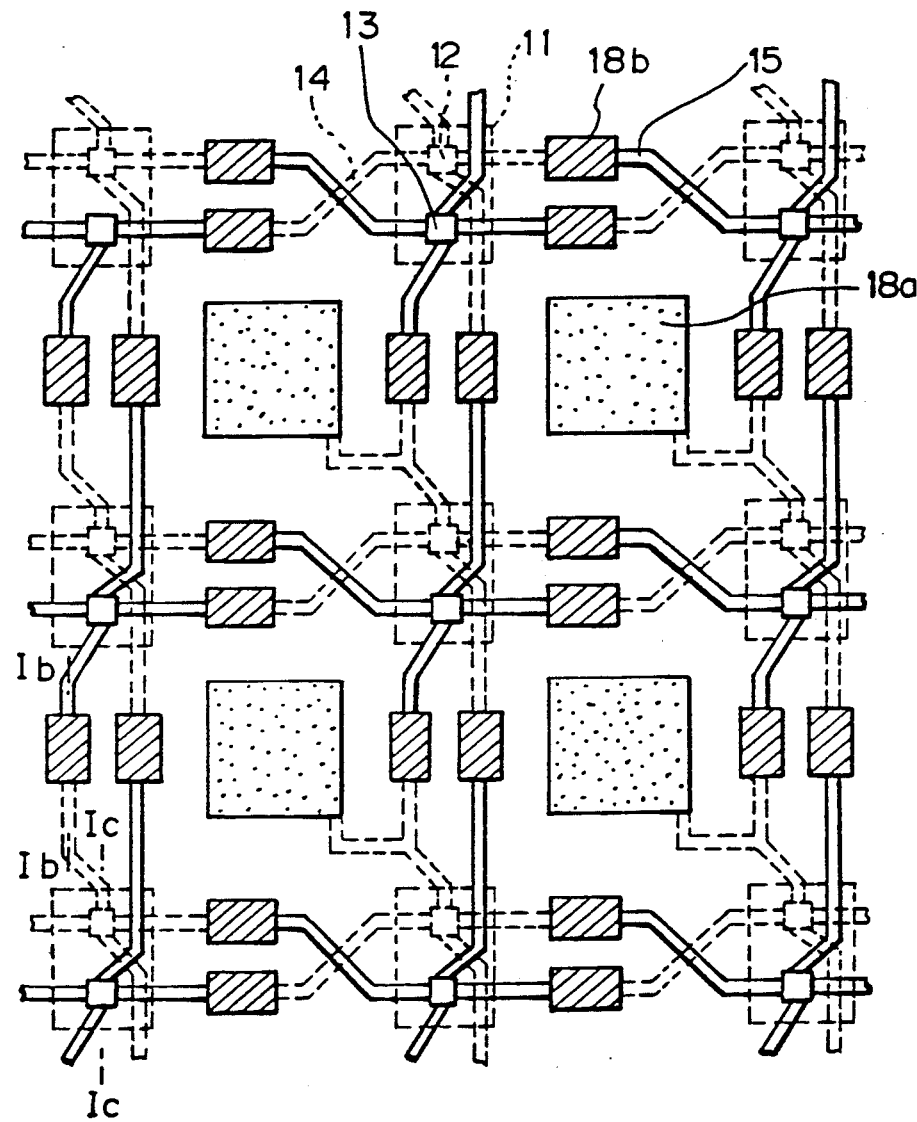
FIGS. 2(a)–(c) are views illustrating the placement and interconnection of an upper-layer neural network of a visual information processing device of the present invention.
Figure 2B:
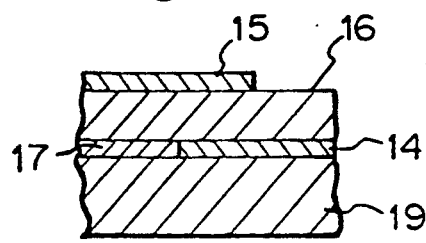
Figure 2C:
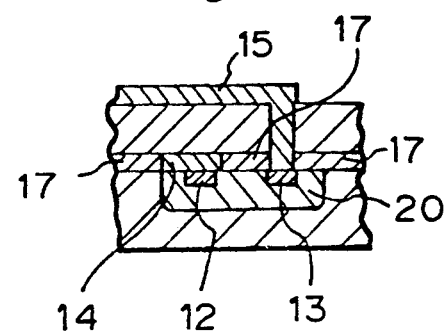
Figure 5:
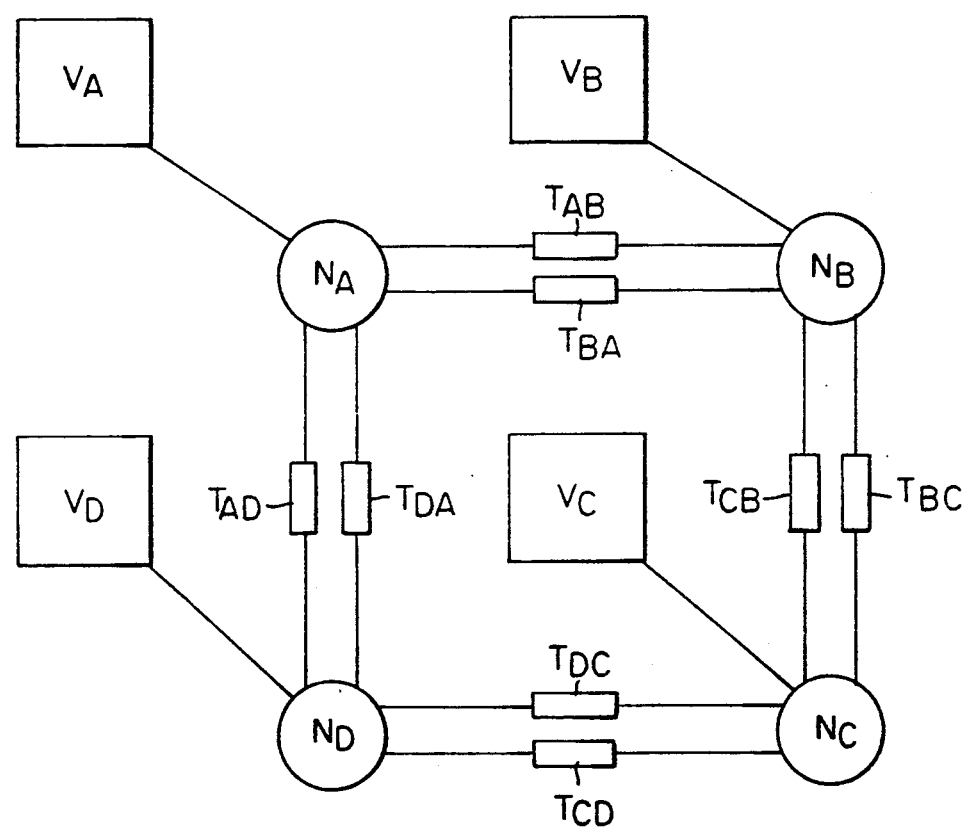
FIG. 5 is a simplified conceptual diagram of the neural network of FIG. 2(a)

FIG. 2 is an illustration of a visual information processing device according to one embodiment of the present invention. In this figure, only one layer of a two-layer structure is shown. Shown in the figure are a neuron circuit region 11 (hereinafter abbreviated to a neuron) formed in an integrated circuit, an input terminal 12 of the neuron, an output terminal 13 of the neuron, a molecule multilayer 16 having a heterojunction, an input wiring 14, under the molecule multiplayer 16, on a semiconductor integrated circuit device, an output wiring 15 on the molecule multilayer 16, an insulation film 17 formed on the integrated circuit, a video signal input section 18a, a silicon substrate 19 forming the integrated circuit, a cross section 20 of the neuron region formed in the integrated circuit, and a section 18b for inputting an $T_{ij}$ signal representing the input and output synapse bonding strength of neighboring neurons. (FIG. 5 is a simplified conceptual diagram of the neural network of FIG. 2A). FIG. 6 is an electrical schematic diagram of FIG. 5. In FIGS. 5 and 6, $V_A \ldots V_D$ correspond to video signal input sections 18(a) of FIG. 2(a), while $N_A \ldots N_D$ correspond to neuron circuits 11 of FIG. 2(a). Also in FIGS. 5 and 6, sections $T_{AB}, T_{BA} \ldots T_{DC}, T_{CD}$ correspond to sections 18b of FIG. 2(a).

The input wiring 12 is formed by vacuum deposition of aluminum and photo-lithography, and the output wiring 13 is formed as a semitransparent aluminum electrode by vacuum deposition of aluminum and photo-lithography. As for the output wiring 13, a transparent electrode such as ITO, Nesa glass or the like can be used. The heterojunction molecule multiplayer 16 is formed in such a way that several layers of hematoporphyrin(IX)-bis (tridecanoylether):Ru(P(OCH$_3$)$_3$)$_2$ [abbreviated to RuHP(Ph)$_2$] are deposited on an integrated circuit on which an under-layer aluminum electrode is formed, by the Languir-Blodgett:LB method and several layers of 7,8-dimethyl-3,10-dinonyl isoalloxiazine (abbreviated to DNI) are deposited thereon. Such a molecule multiplayer having a heterojunction has such properties that a current flowing through electrodes varies according to the intensity of irradiated light.

The neurons formed in the integrated circuit are formed in combination with resistors, capacitors, transistors and so forth by using a conventional LSI fabrication technology.

FIG. 3 shows a visual information processing system constructed using the visual information processing devices shown in FIG. 2. Shown in FIG. 3 are an input video signal 21, a device 22 for emitting a $T_{ij}$ pattern, a half-mirror 23 that transmits an input image signal as it is and that changes the $T_{ij}$ signal in the same direction as that of the input image signal, color filters 24a and 24b formed on the heterojunction molecule multilayer 1, a color filter 25 for converting the input video signal to a monochrome signal, an optical lens system 26 for focusing the input video signal and the $T_{ij}$ signal on a photoelectric conversion section of the visual information processing device, the visual information processing device 27 mentioned above, and an output signal 28.

Figure 4:
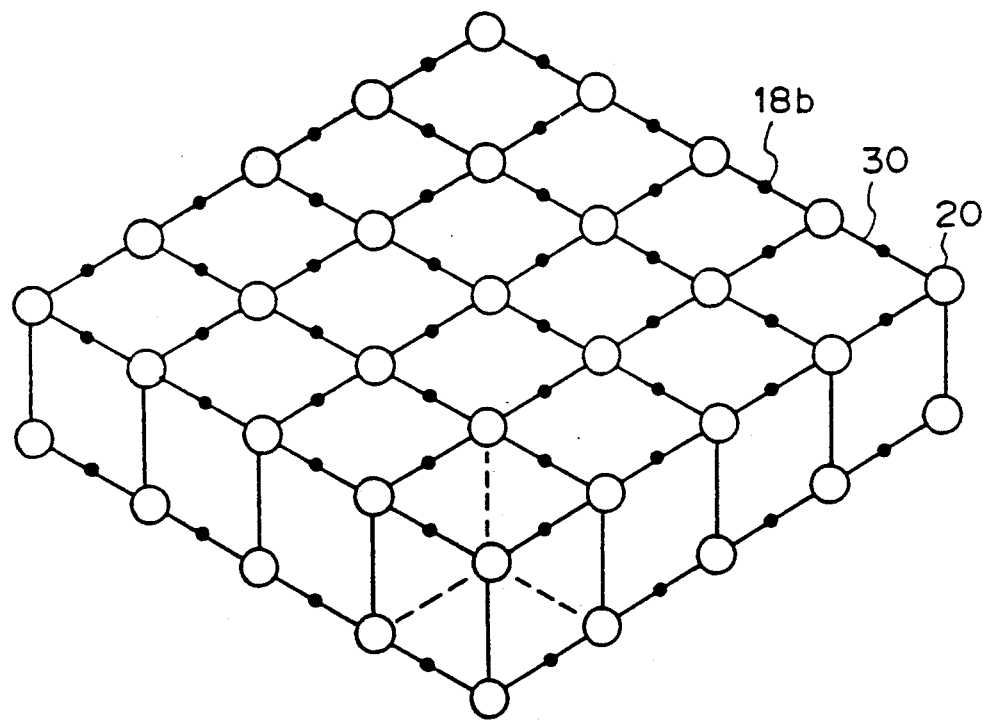
FIG. 4 is a schematic illustration of a neuron network of the visual information processing device of the present invention.

FIG. 4 is a schematic illustration of a neuron network of the visual information processing device. In this figure, the reference number 30 denotes a simplified wiring showing the bonding among the neurons.

Next, the operation will be explained.

The input video signal 21 mixed with a static object and a moving object is irradiated through the band pass filter 25 of 450 nm and regulated by the optical lens system 26 so that the video signal is focused on the video input section 18a of the heterojunction molecule multilayer 16. The filter 24a capable of transmitting light having a wavelength of 500 nm or less is disposed on the video input section 18a.

The $T_{ij}$ optical signal having a wavelength of about 550 to 600 nm is irradiated from the $T_{ij}$ matrix light-emitting device 22, the light path of which is bent by the half-mirror 23, and is irradiated on the $T_{ij}$ input section 18b of the heterojunction molecule multilayer 16. The filter 24b that does not transmit light having a wavelength of 500 nm or less is attached on the $T_{ij}$ input section 18b and this section does not respond to the input video signal.

In the integrated circuit device, the neurons 20 form a network having a two-layer matrix structure shown in FIG. 4 in such a manner that the input and output of neighboring neurons are bonded one another. FIG. 2 shows the wiring state of the structure of one layer of the two-layer structure. Each of the bonding lines 30 among the neurons shown in FIG. 4 is represented by the corresponding two lines in the embodiment in FIG. 2. The bonding section of the input and output of the neighboring neurons corresponds to the $T_{ij}$ input section 18b of the heterojunction molecule multilayer 16. The strength among the respective input/output bonding sections (actually, the magnitude of the resistance thereamong) is determined from the intensity of the light which is irradiated from the respective light matrix elements in the $T_{ij}$ matrix light-emitting device 22 onto the respective input/output bonding sections.

The video input signal is input to the neural network at a certain time interval. If the first video input signal is simultaneously applied to the respective video input sections 18, the input states of the respective neurons are changed so that the entire neural network instantly enters a stable state. When the second video input signal is applied to the sections 18 after a certain time interval, (i) if there is no change between the first and second video input signals, the entire neural network remains in a stable state, and on the other hand (ii) if any video information representative of a moving object is included in the second video input signal and such video information is offset from that included in the first video input signal, although the input states of the respective neurons are changed to disturb the stable state of the neural network, it then instantly enters the next stable state. In the newly entered stable state, the speed vector of the moving object in an X direction can be determined from the output values of the respective neurons of the upper layer, and the speed vector in a Y direction can be determined from the output values of the respective neurons of the lower layer. From these speed vectors, the information regarding the position and speed of the object which has moved can be obtained. In FIG. 3, the images of both a static flower and a flying bee are shown as the input video signal 21, and the image of the flying bee is extracted as the output video signal 28 from the visual information processing device 27.

What is claimed is:

1. A visual information processing apparatus comprising upper and lower neural networks, each of said networks comprising:
   a semiconductor integrated circuit having a plurality of neuron circuits interconnected in a two-dimensional matrix configuration;
   a molecule films means, electrically coupled to said integrated circuit, for producing a photoelectric effect, said molecule film means comprising:
   a plurality of bonding signal input sections interconnecting said plurality of neuron circuits, where said bonding signal represents an input and output synapse bonding strength of adjacent neuron circuits, and
   a plurality of video input means for sensing a visual image comprising a plurality of pixels;
   each neuron circuit corresponds to one pixel of said visual image and each neuron circuit is bonded with neighboring neuron circuits by one of said bonding signal input sections;
   each of said plurality of neuron circuits of said upper neural network is bonded by a connecting neuron circuit with a neuron circuit of said lower neural network.

2. The visual information processing apparatus of claim 1 further comprising a color filter means disposed adjacent said plurality of a bonding signal input sections to prevent said plurality of bonding signal input sections from responding to an input video image.

3. The information processing apparatus of claim 1, wherein each of said neuron circuits of said upper and lower neural networks is coupled with five adjacent neuron circuits through said bonding signal input sections.

4. The visual information processing apparatus of claim 3 in which said molecule film means comprises a molecule multiplier having a heterojunction interposed between electrodes of said neuron circuits.

5. The visual information processing apparatus of claim 3 in combination with a matrix light-emitting device, electrically coupled to said lower neural network of said information processing apparatus, for generating a bonding signal.

6. The combination apparatus of claim 5 further in combination with an input video information source for irradiating an input video information signal onto the video input means of said information processing apparatus.

7. The combination apparatus of claim 5 further wherein said means for supplying further comprises a half mirror for optically coupling said input video information signal and said bonding signal to said visual information processing apparatus.

8. The combination apparatus of claim 7 further in combination with a color filter, disposed intermediately between said input video information source and said half mirror, for converting said input video information signal to a monochrome signal.

9. The combination apparatus of claim 8 further in combination with an optical lens system disposed intermediately between said half mirror and said visual information processing apparatus, for focusing said input video information signal and said bonding signal onto said molecule film means of said visual information processing apparatus.

10. The combination apparatus of claim 9 further in combination with an output video display device, electrically coupled to the neuron circuits of one of said upper and lower neural networks, said visual information processing apparatus, for displaying a processed visual image generated by said visual information processing apparatus.

11. A visual information processing apparatus comprising upper and lower neural networks, each of said networks comprsing:
   a semiconductor integrated circuit having a plurality of neuron circuits interconnected in a two-dimensional matrix configuration;
   a molecule film means, electrically coupled to said integrated circuit, for producing a photoelectric effect, said molecule film means comprising:
   a plurality of bonding signal input sections for photoelectrically interconnecting said plurality of neuron circuits, where said bonding signal represents an input and output synapse bonding strength of adjacent neuron circuits, and
   a plurality of video input means, each electrically couple to a neuron circuit of the upper network, for sensing a visual image comprising a plurality of pixels;
   in combination with a bonding matrix light-emitting device, electrically coupled to the neuron circuits of one of said upper and lower neural networks, for generating a bonding signal, and means, optically coupled to said visual information processing apparatus, for receiving an input video information source signal and for combining and transmitting said input video information source signal and said bonding signal to said neural networks.

12. The visual information processing apparatus of claim 11 wherein said means for combining and transmitting comprises a half-mirror optically coupling said matrix light-emitting device and said input video information source to said visual information processing apparatus.

13. The visual information processing apparatus of claim 11 further in combination with a color filter, disposed intermediately between said input video information source and said means for combining and transmitting, for converting said input video information signal to a monochrome signal.

14. The visual information processing apparatus of claim 13 further in combination with an optical lens system disposed intermediately between said means for combining and transmitting and said visual information processing apparatus, for focusing said input video information signal and said $T_{ij}$ signal onto said molecule film means of said visual information processing apparatus.

15. The visual information processing apparatus of claim 14 further in combination with an output video display device, electrically coupled to said visual information processing apparatus, for displaying a processed visual image generated by said visual information processing apparatus.

16. A visual information processing apparatus having a pair of neural networks which respectively comprise an upper layer and a lower layer of said device, characterized in that each of said pair of neural networks comprises:
   semiconductor integrated circuit means having a plurality of neuron circuit regions which are disposed in a matrix form,
   molecule film means having a photoelectric function and provided on said semiconductor integrated circuit means, said molecule film means having (i) a plurality of bonding signal input sections each performing a wiring function among said plurality of neuron circuit regions, in each of which a bonding signal representing an input and output synapse bonding strength among the plurality of neuron circuit regions is optically written, and (ii) a plurality of video input sections each performing a sensor function of sensing a visual image in which one pixel corresponds to one neuron circuit region; and wiring means for electrically connecting said neuron circuit regions in said semiconductor integrated circuit means with said video input sections in said molecule film means, each of said plurality of neuron circuit regions is bonded with adjacent neuron circuit regions in each of said pair of neural networks comprising the upper and lower layers, and each of said plurality of neuron circuit regions in said upper layers is bonded with a corresponding neuron circuit in said lower layer.

17. The visual information processing apparatus of claim 16 further comprising a color filter means disposed adjacent said plurality of a bonding signal input sections to prevent said plurality of bonding signal input sections from responding to an input video image.

* * * * *